United States Patent
Geerlings

(10) Patent No.: US 9,846,192 B2
(45) Date of Patent: Dec. 19, 2017

(54) SWITCHED PROBE CONTACT

(71) Applicant: NXP B.V., Eindhoven (NL)

(72) Inventor: Jurgen Geerlings, Eindhoven (NL)

(73) Assignee: NXP B.V., Eindhoven (NL)

( * ) Notice: Subject to any disclaimer, the term of this patent is extended or adjusted under 35 U.S.C. 154(b) by 226 days.

(21) Appl. No.: 14/631,548

(22) Filed: Feb. 25, 2015

(65) Prior Publication Data

US 2016/0245859 A1    Aug. 25, 2016

(51) Int. Cl.
G01R 31/00    (2006.01)
G01R 31/28    (2006.01)
G01R 31/317   (2006.01)
G01R 1/067    (2006.01)

(52) U.S. Cl.
CPC ......... *G01R 31/2886* (2013.01); *G01R 1/067* (2013.01); *G01R 31/2884* (2013.01); *G01R 31/31713* (2013.01); *G01R 31/31724* (2013.01)

(58) Field of Classification Search
CPC .............. G01R 1/0416; G01R 1/06727; G01R 31/2868; G01R 31/2893; G01R 31/2896; G01R 31/2601; G01R 31/2891
See application file for complete search history.

(56) References Cited

U.S. PATENT DOCUMENTS

| | | | | |
|---|---|---|---|---|
| 4,743,841 A * | 5/1988 | Takeuchi | ............ | G01R 31/2884 324/750.3 |
| 5,077,596 A * | 12/1991 | Inoue | ................... | G01R 31/316 257/213 |
| 5,731,945 A * | 3/1998 | Bertin | ................. | H01L 23/5286 257/E23.153 |
| 5,796,266 A * | 8/1998 | Wright | ............... | G01R 31/2648 324/750.3 |
| 5,818,114 A | 10/1998 | Pendse et al. | | |
| 5,929,655 A | 7/1999 | Roe et al. | | |
| 6,044,692 A * | 4/2000 | Bowling | ............... | G01M 3/188 73/40 |
| 6,121,785 A * | 9/2000 | Wright | ............... | G01R 31/2648 324/762.03 |
| 6,507,117 B1 | 1/2003 | Hikita et al. | | |
| 6,566,911 B1 | 5/2003 | Moyer | | |

(Continued)

OTHER PUBLICATIONS

Extended European Search Report for European Patent Appl. No. 16151765.1 dated Jul. 22, 2016.

*Primary Examiner* — Tung X Nguyen
*Assistant Examiner* — Dominic Hawkins

(57) ABSTRACT

Aspects of the present disclosure are directed to methods, apparatuses and systems involving a switched probe contact. According to an example embodiment, an apparatus includes logic circuitry, a first circuit to communicate signals with the logic circuitry, and a first bond pad connected to the first circuit via a first circuit path. The apparatus also includes a second circuit to communicate signals with the logic circuitry, and a second bond pad connected to the second circuit via a second circuit path. A probe contact is connected to the first bond pad and communicates signals with an external probe, and a switch circuit is connected to the probe contact and the second circuit path. The switch circuit communicates signals between the probe contact and the second circuit path by selectively connecting and disconnecting the probe contact to the second circuit path.

20 Claims, 3 Drawing Sheets

(56) References Cited

U.S. PATENT DOCUMENTS

| | | | |
|---|---|---|---|
| 6,597,187 B2* | 7/2003 | Eldridge | G01R 1/07307 |
| | | | 257/E23.079 |
| 6,940,300 B1* | 9/2005 | Jenkins | G09G 3/006 |
| | | | 324/754.03 |
| 7,002,364 B2* | 2/2006 | Kang | G01R 31/31715 |
| | | | 324/750.3 |
| 9,684,474 B2* | 6/2017 | Somaiya | G11C 16/24 |
| 2007/0079200 A1* | 4/2007 | Tabatabaei | G01R 31/31715 |
| | | | 714/733 |
| 2007/0200571 A1* | 8/2007 | Quinn | G01R 31/31926 |
| | | | 324/754.1 |
| 2008/0017856 A1* | 1/2008 | Fujino | G01R 31/2884 |
| | | | 257/48 |
| 2010/0018286 A1* | 1/2010 | Numajiri | G01R 31/3191 |
| | | | 73/1.79 |
| 2011/0156731 A1 | 6/2011 | Yoon et al. | |
| 2011/0156738 A1 | 6/2011 | Jeon et al. | |
| 2012/0212251 A1* | 8/2012 | Yanagishima | H03K 17/61 |
| | | | 324/762.01 |
| 2013/0244452 A1* | 9/2013 | Huang | H01R 13/66 |
| | | | 439/51 |
| 2013/0321962 A1* | 12/2013 | Lai | H01L 27/0292 |
| | | | 361/56 |
| 2014/0145743 A1* | 5/2014 | Kanev | G01R 31/2868 |
| | | | 324/757.01 |
| 2016/0061886 A1* | 3/2016 | Kim | G01R 31/2884 |
| | | | 324/762.06 |

* cited by examiner

SWITCHED PROBE CONTACT

Aspects of various embodiments are directed to integrated circuit apparatuses and more particularly to apparatuses and methods having a switched probe contact.

Many integrated circuits (ICs) employ a plurality of input/output (IO) circuits, sometimes referred to as IO cells, which are used to communicate signals between main/logic circuitry of the IC and external circuits. Such IO cells generally have a bond pad that is used to bond a wire (e.g., a bond wire) from the bond pad to an IC package including the IC.

For many applications, it is desirable to test the IC during design, manufacture or otherwise. To facilitate testing, many such IO cells include a probe contact that is coupled to provide probing of the IO pad. The probe contact allows for external signals, such as signals used during testing, to access the IC when the IC is not yet packaged (e.g., before bond wires are attached to the bond pads, as noted above).

Testing approaches as noted above have been useful for ensuring proper operation of the IC. However, facilitating such probing and test access can be challenging or costly to implement. For instance, in an IC that has a relatively small core area compared to the number of IO cells for access and/or testing, the core parameter may be less than the length required to place the IO cells. Such an IC apparatus can be referred to as "pad limited design." Such a design may require an increase in size of the IC in order to achieve the desired number of IO cells (e.g., by providing non-used, white space), or stacking of IO cells.

These and other matters have presented challenges to IC design, testing and implementation, for a variety of applications.

Various example embodiments are directed to integrated circuits and their implementation. According to an example embodiment, an apparatus includes logic circuitry that provides a logic function by processing input signals and providing output signals corresponding (e.g., in response) to the input signals with the logic function applied thereto. A first circuit (e.g., an input-output (I/O) circuit) communicates signals with the logic circuitry. A first bond pad is connected to the first circuit, via a first circuit path, and communicates signals with the logic circuitry via the first circuit. The apparatus further includes a second circuit that communicates signals with the logic circuitry. A second bond pad is connected to the second circuit, via a second circuit path, and communicates signals with the logic circuitry via the second circuit. Further, the apparatus includes a probe contact that is connected to the first bond pad and communicates signals with an external probe in contact therewith. A switch circuit is connected to the probe contact and the second circuit path, and communicates signals between the probe contact and the second circuit path by selectively connecting and disconnecting the probe contact to the second circuit path in response to the input signals. In various embodiments, the apparatus also includes test circuitry that provides input signals and reads output signals via the probe contact (e.g., via connection there to by a probe).

According to a further example embodiment, a method includes using test circuitry and a switched probe contact to provide input signals and read output signals. Logic circuitry is operated to provide logic functions based on the input signals, which are coupled to the logic circuitry from the probe contact. Output signals are coupled from the logic circuitry to the probe contact via a first circuit that communicates signals with the logic circuitry. The first circuit is connected to a first bond pad via a first circuit path. The input signals are coupled from the probe contact to different portions of the logic circuitry by operating a switch circuit to selectively connect and disconnect the probe contact to a second circuit in response to the input signals. The second circuit path is connected to a second bond pad via a second circuit path.

The above discussion/summary is not intended to describe each embodiment or every implementation of the present disclosure. The figures and detailed description that follow also exemplify various embodiments.

Various example embodiments may be more completely understood in consideration of the following detailed description in connection with the accompanying drawings, in which.

Figure 1:
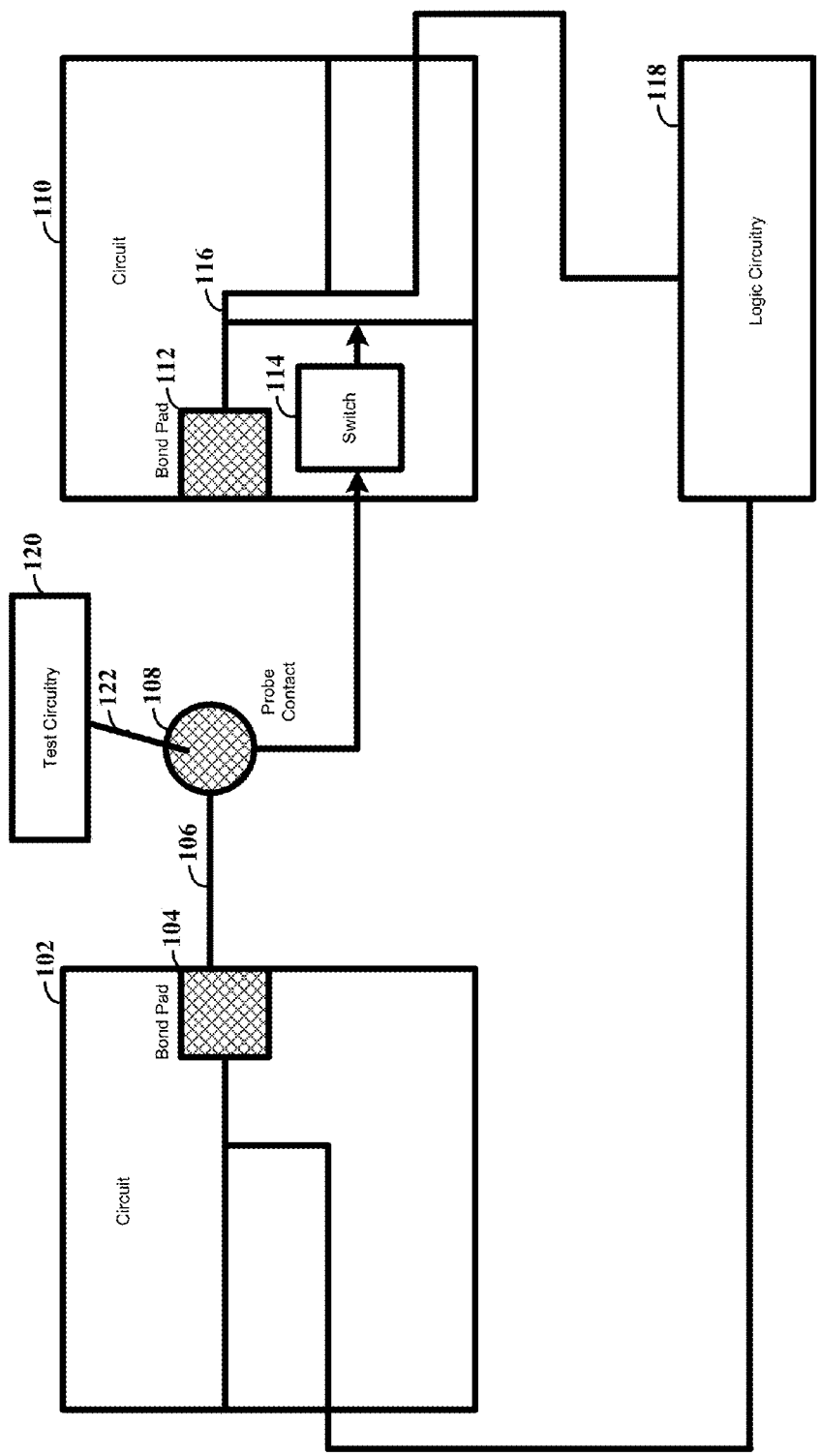
FIG. 1 shows an example apparatus according to various embodiments of the present disclosure.

While various embodiments discussed herein are amenable to modifications and alternative forms, aspects thereof have been shown by way of example in the drawings and will be described in detail. It should be understood, however, that the intention is not to limit the invention to the particular embodiments described. On the contrary, the intention is to cover all modifications, equivalents, and alternatives falling within the scope of the disclosure including aspects defined in the claims. In addition, the term "example" as used throughout this application is only by way of illustration, and not limitation.

Aspects of the present disclosure are believed to be applicable to a variety of different types of apparatuses, systems and methods involving a first bond pad, a second bond pad, and a probe contact that is connected to the first bond pad and selectively connected to the second bond pad. In certain implementations, aspects of the present disclosure have been shown to be beneficial when used in the context of a single IO cell containing two circuits sharing a common bond pad and other circuitry. Using these approaches, a single probe contact can be used for accessing multiple cells, which can reduce a total number of probe contacts needed for testing a particular logic circuitry. By controlling a switch or other connectivity-type component, signals are communicated between the probe contact and different input cells, output cells or I/O cells, without necessarily requiring probe contacts for each cell. Other aspects are directed to test circuitry used to test circuits via the probe contact. These and other aspects can be implemented to address challenges, including those discussed in the background above. While not necessarily so limited, various aspects may be appreciated through a discussion of examples using such exemplary contexts.

According to various example embodiments, aspects of the present disclosure are directed to an IC with two IO type circuits, each of which has a bonding pad and shares a probe contact. By sharing the probe contact, overall area required for probing (testing) can be limited, relative to using additional probe contacts. Further, the height of the IO circuits with such a shared probe contact can be set less than the height of stacked IO cells, and provide a desirably small die area (e.g., a bond probe height can be equal to the pitch (e.g., a minimum pitch, such as 0.06 mm)).

The shared probe contact can be used to test the IC, with circuitry coupled to each bond pad. For example, external input/output pins of the IC can be sequentially scanned, test data can be input and output from the IC, and/or both an internal function of the IC and an implemented printed circuit board can be tested functionally. Such testing (and others as described herein) may, for example, include applying test signals along a boundary of an IC in which boundary cells couple test inputs and outputs to and from logic circuitry for communication to an external tester. In certain embodiments, such an approach is implemented in accordance with a boundary-scan type approach such as those in accordance with IEEE Standard 1149.1 (e.g., those employing hardware and/or software available from the Joint Test Action Group (JTAG) and pertaining to this standard).

In various embodiments, IO cells as noted above are placed at an edge of a die in an IO ring type structure, with logic circuitry of an IC being on the die (e.g., in a central portion surrounded by the ring). Such IO cells may have the same height and be arranged such that common input signals, such as power supply or ESD protection signals, can be shared. Certain embodiments involve placing IO cells in two rows on one or more sides of a die, which can be referred to as a "double row IO ring" arrangement. The "effective placement pitch" is smaller than the minimum width of the I/O cells, so more IO cells can be placed on a given length or width of the die.

In various embodiments, an apparatus includes logic circuitry that provides a logic function by processing input signals and providing output signals corresponding to the input signals with the logic function applied thereto. The apparatus includes a first circuit to communicate signals with the logic circuitry and a first bond pad, connected to the first circuit via a first circuit path, to communicate signals with the logic circuitry via the first circuit. The apparatus further includes a second circuit to communicate signals with the logic circuitry and a second bond pad, connected to the second circuit via a second circuit path, to communicate signals with the logic circuitry via the second circuit. A probe contact is connected to the first bond pad to communicate signals with an external probe in contact with the probe contact. Further, the apparatus includes a switch circuit connected to the probe contact and the second circuit path.

The switch circuit selectively connects and disconnects the probe contact to the second circuit path in response to the input signals to communicate signals between the probe contact and the second circuit path. In this context, the switch circuit may be controlled by a probe connected to the probe contact or via aspects of the input signals provided via another probe and probe contact, and may switch or otherwise control an impedance that provides the selective connectivity. In certain implementations, switch control circuitry is coupled to the probe contact or a different probe contact and controls the switch circuit for providing the selective connection (e.g., based on control signals coupled thereto via one of the probe contacts). In certain implementations, the control circuitry is part of the logic circuitry.

In various embodiments, the input signal as noted above is an input test signal, the first circuit is an input/output (I/O) cell that communicates test signals with the logic circuitry, and the second circuit is an input cell that communicates test signals with the logic circuitry. The switch selectively connects and disconnects the probe contact to the second circuit path by selectively coupling the input test signal to the second circuit path. In certain embodiments, both circuits are part of a common I/O cell with shared circuitry such as power, ESD protection, logic circuitry connectors and others.

Various embodiments involve additional circuits/cells with respective bond pads and switch circuitry. For instance, several input cells may be coupled to a single probe contact, with one or more switches operating to connect the probe contact selectively to each input cell. This connection may be effected serially, to respectively probe different areas or circuitry in the logic circuitry sequentially. As such, additional switch circuits connected to the probe contact communicate signals between the probe contact and additional circuit paths by selectively connecting and disconnecting the probe contact in response to the input signals (as received via one or more probe contacts). In some implementations, a single switch circuit connects the probe contact with multiple sets of circuitry (e.g., via multiplexing).

Respective first and second bond pads and related circuitry, probe contact and switch circuits as noted above may be implemented with the test circuitry in this regard. For instance, an input or IO circuit may communicate input signals from the test circuit to the logic circuitry, and an (IO) circuit may communicate output signals from the logic circuitry to the test circuit. The switch may be controlled to effect this communication, with a first input signal used to operate the switch to inhibit connection of the probe contact, and a second input signal used to connect the probe contact. During and/or after testing, the respective bond pads may be coupled to the logic circuitry. Consistent with other embodiments, a single I/O cell includes the bond pads and switch circuitry, as well as shared circuitry such as a power rail and electrostatic discharge protection circuitry.

In accordance with various method-based embodiments, a switching approach is used to couple input and output signals to different cells from a common probe contact. The input signals are provided by test circuitry and coupled to the probe contact using a probe, and passed to one of a plurality of cells by a switch (e.g., controlled via the signals). The input signals are used in operating logic circuitry to provide logic functions that are based on the input signals, and which provide output signals to the test circuitry (e.g., also via the probe contact). In this context, first and second input-type cells having respective bond pads and related circuit paths to the logic circuitry can be coupled to the common probe contact, with signals being switched relative to the probe contact for communicating to/from the logic circuitry.

Turning now to the figures, FIG. 1 shows an example apparatus, as may be implemented in accordance with one or more embodiments of the present disclosure. As illustrated by FIG. 1, various apparatus embodiments include a first circuit 102 and a second circuit 110, which respectively operate as an IO type circuit (e.g., input circuit, output circuit or input-output circuit), with a switched probe contact that is selectively coupled to one or more cells. In some embodiments, the first and second circuits 102/110 share various circuitry, such as power rails. Further, in various embodiments, the first circuit 102 is an IO circuit and the second circuit 110 is an input circuit.

The first circuit 102 is coupled to communicate signals with logic circuitry 118 of the apparatus, as discussed further herein. A first bond pad 104 is connected to the first circuit 102 via a first circuit path 106 and communicates signals with the logic circuitry via the first circuit 102. The second circuit 110 is coupled to communicate signals with the logic circuitry 118 of the apparatus. A second bond pad 112 is connected to the second circuit 110 via a second circuit path 116 and communicates signals with the logic circuitry via the second circuit 110.

A probe contact 108 is connected to the first bond pad 104 (e.g., via the first circuit path 106). The probe contact 108 communicates signals with an external probe 122, which is further in contact with test circuitry 120 to communicate signals, as discussed further herein.

As further illustrated by FIG. 1, a switch circuit 114 is connected to the probe contact 108 and the second circuit path 116 of the second circuit 110. The switch circuit 114 communicates signals between the probe contact 108 and the second circuit path 116 by selectively connecting and disconnecting the probe contact 108 to the second circuit path 116 in response to the input signals. For example, the switch circuit 114 selectively connects the probe contact 108 to the second circuit path 116, such as by selectively providing impedance values that connect or inhibit communication of signals between the probe contact 108 and the second circuit path 116.

The logic circuitry 118, in some embodiments, provides a logic function by processing input signals and providing output signals corresponding to the input signals with the logic function applied thereto. The first and second circuits 102, 110 are associated with different portions of the logic circuitry, in some embodiments. For instance, the first circuit 102 may be implemented to input test signals between the probe contact 108 and a first portion of the logic circuitry 118, with the second circuit 110 coupling input test signals between the probe contact 108 and a second portion of the logic circuitry 118. With this approach, different portions of the logic circuitry may be tested using the shared probe contact 108. Such an approach may be carried out serially, such that a first set of test signals is coupled to the first portion of the logic circuitry 118 during a first time period, and thereafter a second set of test signals is coupled to a second (e.g., different) portion of the logic circuitry.

In various embodiments, the test circuitry 120 provides input signals and reads output signals. In some implementations, the input signals control the switch circuit 114 to connect or disconnect the probe contact 108 to the second circuit path 116. In other implementations, input signals from another probe contact are used to control the switch circuit 114. For example, the input signal (e.g., from the test circuitry 120) may selectively enable a test mode of the first circuit 102 and the second circuit 110. The first circuit 102 and second circuit 110 respond to the input signal in response to being in an enabled test mode, by passing signals between the probe contact 108 and the logic circuitry 118.

In a particular implementation, the test circuitry 120 provides a first input signal to the probe contact 108 via the external probe 122 to inhibit connection of the probe contact 108 to the second circuit path 116 for a first period of time. The first circuit 102 responds to the first input signal by passing signals between the probe contact 108 and the logic circuitry 118. The test circuitry 120 provides a second input signal via the external probe 122 to control the switch circuit 114 to connect the probe contact 108 to the second circuit path 116 for a second period of time, after the first period of time. The second circuit 110 responds to the second input signal by passing signals between the probe contact 108 and the logic circuitry 118.

In certain embodiments, the apparatus as illustrated in FIG. 1 utilizes the first circuit 102 as an IO circuit with the second circuit 110 as an input circuit. The switch circuit connects the probe area to the input circuit in response input signals. The input currents are small compared to output signals and often only switching voltage levels are tested.

Various embodiments (e.g., as may be implemented with FIG. 1) employ a dual bond pad apparatus with a shared probe area to reduce the area penalty of IO cells as compared to a double row IO ring and/or other techniques. An example calculation of the area of a double row IO ring is as follows. Assuming a core area of an IC apparatus is 2×2 and an IO cell has dimensions of 0.06×0.15 width×height, the number of IO cells that fit on one side of the IC equals the integer of (2/0.06)+1=34, and on all four sides equals 136. In this case, the total core area including the IO cell ring becomes (0.15+2+0.15)^2. If n more than 136 IO cells are placed then the die perimeter can be increased by:

(a.) 0.06n when using a single IO cell row or (b.) placing the IO cells in two rows starting at one side and using more sides if needed. The total core area including the IO ring becomes, for n≤2×34:

case a. (0.15+2+0.06.integer((n+1)/2)+0.15)×(0.15+2+0.15) when all extra IO cells are placed on two opposing sides, case b1. (0.15+0.15+2+0.15)×(0.15+2+0.15) for n≤34 when a double row IO cell ring is placed on 1 die side, and case b2. (0.15+0.15+2+0.15)×(0.15+0.15+2+0.15) for n≤2x34 when a double row IO cell ring is placed on 2 die sides. In such an example, the die area (a) is larger than area (b) 0.06.integer((n+1)/2)>0.15 or for n>4.

In accordance with some embodiments, the height of a dual bond pad apparatus, such as the apparatus illustrated by FIG. 1, is not twice the height of a standard IO cell but the height of a single IO cell plus the height of the probe contact. For example, the bond pad height is equal to the pitch (e.g., the minimum pitch, such as 0.06). An example of a relative area reduction for a single sided two row design, as compared to a dual IO ring design, can include:

$$(0.15+0.06+2+0.15) \times (0.15+2+0.15)/(0.15+0.15+2+0.15) \times (0.15+2+0.15) = 96.3\%.$$

In accordance with various embodiments, pad limited designs are implemented with a small core area of an IC apparatus, as compared to the number of IO cells and the IO cell dimensions. An IO cell in this context may include IO circuitry, IO ring signals (power, ESD protection, IO ring control signals), a metal stack for mechanical robustness, a bond pad and a probe contact. The bond pad is large enough to allow for bonding a wire and the probe area is be large enough to support a probe needle. Each IO cell, in accordance with various embodiments, includes two or more circuits, each having a bond pad and sharing one probe contact. A switch circuit inside the IO cell selects the bond pad that is routed to the probe contact to selectively communicate input signals to the circuits.

The various embodiments described herein may be combined in certain embodiments, and various aspects of individual embodiments may be implemented as separate embodiments. For instance, aspects of FIG. 1 can be utilized to perform the process described in FIG. 3 and/or can be a portion of the apparatus described in FIG. 2. For example, apparatus embodiments in accordance with the present disclosure are not limited to a single IO cell and/or a first and a second circuit as characterized herein. Further, embodiments are not limited to an IO cell containing an IO circuit and an input circuit. Apparatus embodiments can include an IO circuit and more than one input circuit forming an IO cell (e.g., as illustrated by FIG. 2), two IO circuits, multiple IO cells as described by FIG. 1 arranged around the perimeter of an IC apparatus, and/or one or more IO cells as described by FIG. 1 and one or more IO cells with a single bond pad arranged around the perimeter of an IC apparatus, among other arrangements.

Figure 2:
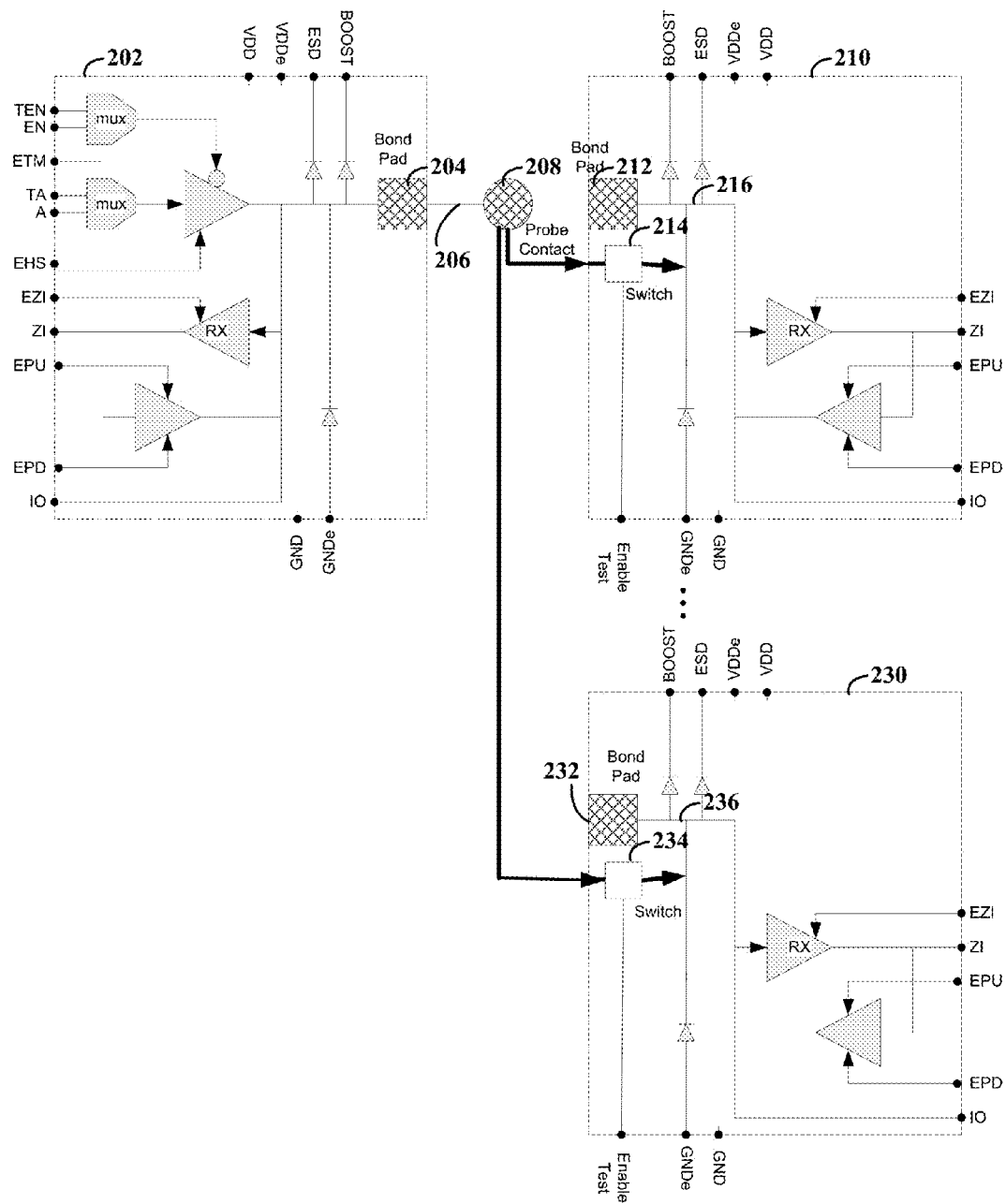
FIG. 2 shows an example apparatus according to various embodiments of the present disclosure.

FIG. 2 shows an apparatus, as may be implemented in accordance with one or more embodiments of the present disclosure. As illustrated by FIG. 2, example apparatus embodiments include an IO circuit (e.g., circuit 202) and multiple input circuits (e.g., circuit 210 and circuit 230) sharing a probe contact 208. The various circuits have a number of input and output paths to communicate signals. The output path to the bond pad 204 is driven by input A and has an output enable controlled by input EN. The output drive speed is set by input signal EHS. A test mode is enabled by signal ETM. In this mode, test input TA and test output enable TEN are used to test the output path. The input path from the bond pad 204 to the receiver RX drives the internal output signal ZI. The receiver can be enabled by control signal EZI. The IO cell input can be pulled up to VDDe and/or down to GNDe by a weak driver which is controlled by EPU to pull up and by EPD to pull down. The bond pad 204 is protected against external ESD voltages by a diode connected to a BOOST ESD supply rail, a diode connected to an ESD rail and a diode connected to the external ground supply GNDe. The IO cell is powered by VDD and GND for the core IO cell supply and VDDe and GNDe for the external IO cell supply.

Similarly, the input path (e.g., circuit path 216) from bond pad 212 to the receiver RX of the circuit 210 (or circuit path 236 from the bond pad 232 to the receiver RX of the circuit 230) drives the internal output signal ZI. The receiver can be enabled by control signal EZI. Embodiments in accordance with the present disclosure can include additional control signals not illustrated by FIG. 2, with various implementations of the probe contact 208 being used accordingly.

The circuits 202, 210, 230, in various embodiments, are incorporated in a single IO cell sharing the probe contact 208 and/or other circuitry. Each circuit 202, 210, 230 includes a bond pad 204, 212, 232 connected to the respective circuits via a circuit path 216, 236 to communicate signals with logic circuitry. As may be implemented in manner similar to that previously described in connection with FIG. 1, a switch circuit 214 connected to the probe contact 208 and the circuit path 216 communicates signals between the probe contact 208 and the circuit path 216 by selectively connecting and disconnecting the probe contact 208 to the circuit path 216 in response to input signals (e.g., from the test circuitry coupled to the probe contact). In these and other contexts, the apparatus in FIG. 2 may include various features illustrated by and discussed in connection with FIG. 1 (e.g., test circuitry, an external probe, and logic circuitry).

In some embodiments, the circuits 202, 210, and 230 are coupled to communicate signals with logic circuitry of the apparatus as follows. Bond pad 204 is connected to the first circuit 202 to communicate signals with the logic circuitry via the circuit 202. Further, bond pad 212 is connected to the circuit 210 via a second circuit path 216 to communicate signals with the logic circuitry via the circuit 210. Bond pad 232 is connected to the circuit 230 via a circuit path 236 and communicates signals with the logic circuitry via the circuit 230.

In accordance with one or more embodiments, the apparatus includes an additional switch circuit 234 connected to the probe contact 208 and the circuit path 236. The additional switch circuit 234 communicates signals between the probe contact 208 and the circuit path 236 by selectively connecting and disconnecting the probe contact 208 to the circuit path 236 in response to the input signals (e.g., from the test circuitry, as described above in connection with FIG. 1).

In some embodiments, the circuits 202, 210, 230 couple input signals, e.g., test signals, between the probe contact 208 and different portions of the logic circuitry. For example, the circuit 210 may couple test signals between the probe contact 208 and a portion of the logic circuitry, and the circuit 230 couples test signals between the probe contact 208 and a different portion of the logic circuitry. In some embodiments, the circuit 202 couples test signals between the probe contact 208 and another portion of the logic circuitry. In this context, the additional switch circuit 234 and the switch circuit 214 may couple input signals to different portions of the logic circuitry at different times, based upon data in the input signals.

The switch circuit 214 and the additional switch circuit 234, in some embodiments, serially couple test signals to the circuits 202, 210, and 230. For example, the switch circuit 214 and additional switch circuit 234 may connect the circuit 210 to the probe contact 208 for a first time period and disconnect the circuit 210 from the probe contact 208 after the first time period. Further, the switch circuit 214 and additional switch circuit 234, in such embodiments, may connect the circuit 230 to the probe contact 208 for a second time period after the circuit 210 is disconnected from the probe contact 208, and disconnect the circuit 230 from the probe contact 208 after the second time period.

In some embodiments, the input signals (e.g., from test circuitry) enable a test mode of the circuits 202, 210, and 230. For example, the input signals may control when the switch circuit 214 connects or disconnects the probe contact 208 to the circuit path 216 and when the additional switch circuit 234 connects or disconnects the probe contact 208 to the circuit path 236. The input signal may be used to selectively enable a test mode of the circuit 202, the circuit 210, and the circuit 230. The circuits 202, 210, and 230 respond to the input signal in response to being in an enabled test mode, by passing signals between the probe contact 208 and the logic circuitry. The test mode of the circuits 210 and 230 is enabled by input enable test.

Although the embodiment of FIG. 2 illustrates an apparatus including a single IO cell having an IO circuit and two input circuits, embodiments in accordance with the present disclosure are not so limited. For example, a single IO cell can contain more or fewer circuits than illustrated by FIG. 2.

Figure 3:
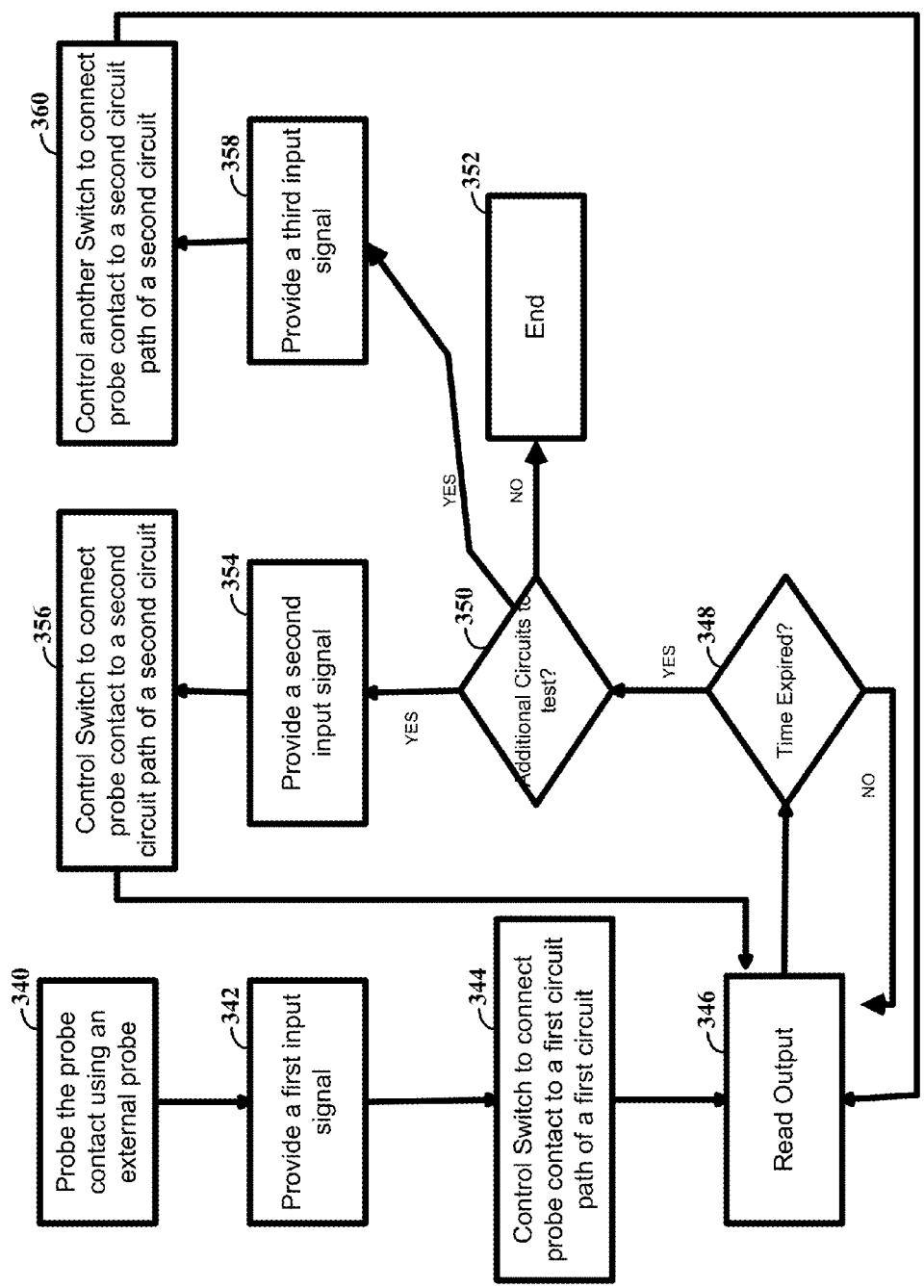
FIG. 3 shows a flow diagram of an example process for selecting and deselecting circuits using a shared probe pad according to various embodiments of the present disclosure.

FIG. 3 shows a flow diagram of an example process for selecting and deselecting circuits using a shared probe contact according to various embodiments of the present disclosure. The apparatus illustrated by FIG. 1 and/or FIG. 2, in various embodiments, may be implemented to perform the process or processes illustrated by FIG. 3. For example, the process illustrated by FIG. 3 can be used to couple input signals from a probe contact to different portions of the logic circuitry.

At block 340, a probe contact of an apparatus is probed using an external probe, which is connected to test circuitry and to the probe contact. The test circuitry may control a test of the IC apparatus using input test signals, such boundary scan signals. The probe contact, in various embodiments, is shared by multiple circuits in a single IO cell. At block 342, a first input signal is provided from the test circuitry to the probe contact via the external probe. The test circuitry, at block 344, controls a switch circuit to connect the probe contact to a first circuit path of a first circuit for a first period of time via the first input signal. The first input signal may thus enable a test mode of the first circuit. At block 346, the test circuitry reads an output of the first input signal of the first circuit during the first period of time and may also read a signal derived from the input signal (e.g., if the input signal is a voltage signal, the test circuitry may read the current flow caused by the input voltage). The first circuit responds to the first input signal in the first period of time by passing signals between the probe contact and the logic circuitry. The signals, in some embodiments, are passed to a first portion of the logic circuitry and output signals from the first portion of the logic circuitry are provided to the test circuitry.

At block 348, the test circuitry determines if the period of time (e.g., the first period of time) expired. In response to the period of time not expiring, the test circuitry continues to read outputs from the first circuit, at block 346. In response to the period of time expiring, the test circuitry determines if there are additional circuits to test that are associated with the probe contact, at block 350. As previously described, two or more circuits share a probe contact.

In response to determining there are no additional circuits to test, at block 352, the process can end. In response to determining there are additional circuits to test, at block 354, the process includes providing a second input signal from the test circuitry to the probe contact via the external probe. In some embodiments, the first circuit includes an IO circuit connected to the probe contact via a bond wire. Alternatively, the first circuit includes an input circuit. In such embodiments, the process includes the test circuitry controlling the switch circuit to disconnect the probe contact from the first circuit path of the first circuit after the first period of time. Further, at block 356, the test circuitry controls the switch circuit to connect the probe contact to a second circuit path of a second circuit for a second period of time after the first period of time via a second input signal provided from the test circuitry.

Similarly, the process includes reading an output of the second input signal of the second circuit during the second period of time, at block 346, determining if the period of time (e.g., the second period of time) expired, at block 348, and/or determining if there are additional circuits to test, at block 350. The second circuit responds to the second input signal in the second period of time by passing signals between the probe contact and the logic circuitry. The signals, in some embodiments, are passed to a second portion of the logic circuitry and output signals from the second portion of the logic circuitry are provided to the test circuitry.

In various embodiments, the probe contact is shared by more than two circuits. In such embodiments, the process, at block 358, includes providing a third input signal from the test circuitry to the probe contact via the external probe. The test circuitry, at block 360, controls the switch circuit to disconnect the probe contact to the second circuit path of the second circuit after the second period of time and controls another switch circuit to connect the probe contact to a third circuit path of a third circuit for a third period of time (after the second period of time) via the third input signal. The process includes reading an output of the third input signal of the third circuit during the third period of time, at block 346, determining if the period of time (e.g., the third period of time) expired, at block 348, and/or determining if there are additional circuits to test, at block 350. The signals, in some embodiments, are passed to a third portion of the logic circuitry and output signals from the third portion of the logic circuitry are provided to the test circuitry.

Although the example process of FIG. 3 illustrates three circuits, embodiments in accordance with the present disclosure are not so limited. For example, a probe contact can be shared by more or less than three circuits. In embodiments including an apparatus with greater than three circuits, the additional circuits each contain an additional switch circuit connected to the probe contact and configured and arranged to connect the probe contact to a circuit path of the additional circuits. Furthermore, the input signals (e.g., the first, second, and third input signal), in accordance with some embodiments, each include a plurality of signals.

Accordingly, various embodiments are directed to using test circuitry, providing input signals and reading output signals via a switched probe contact. Logic circuitry is operated to provide logic functions, based on the input signals, which provide the output signals by coupling the input signals to a probe contact, and coupling output signals from the logic circuitry to the probe contact via a first circuit that communicates signals with the logic circuitry. Input signals are coupled from the probe contact to different portions of the logic circuitry by operating a switch circuit to selectively connect and disconnect the probe contact to a second circuit in response to the input signals. Operating the switch circuit, in various embodiments, includes controlling the switch circuit by applying switch control signals in the input signals to the probe contact.

Coupling the input signals from the probe contact to the different portions of the logic circuitry, in accordance with some embodiments, includes coupling input signals from the probe contact to a first portion of the logic circuitry for a first period of time. The input signals, in such embodiments, specify a test for a logic function to be carried out by a first portion of the logic circuitry. Output signals can be provided from the first portion of the logic circuitry to the test circuitry (e.g., via the first circuit), after which additional input signals may be coupled from the probe contact to a second portion of the logic circuitry for a second period of time. The input signals specify or otherwise effect a test for a logic function to be carried out by the second portion of the logic circuitry. The second output signals are provided from the second portion of the logic circuitry to the test circuitry.

Various blocks, modules or other circuits may be implemented to carry out one or more of the operations and activities described herein and/or shown in the figures. In these contexts, a "block" (also sometimes "circuit", "logic circuitry", or "module") is a circuit that carries out one or more of these or related operations/activities (e.g., provide a logic function, provide output signals, or communicate signals with the logic circuitry). For example, in certain of the above-discussed embodiments, one or more modules are discreet logic circuits or programmable logic circuits configured and arranged for implementing these operations/activities, as in the circuit modules shown in FIG. 1 (e.g., test circuitry). In certain embodiments, such a programmable circuit is one or more computer circuits programmed to execute a set (or sets) of instructions (and/or configuration data). The instructions (and/or configuration data) can be in the form of firmware or software stored in and accessible from a memory (circuit). As an example, first and second modules include a combination of a CPU hardware-based circuit and a set of instructions in the form of firmware, where the first module includes a first CPU hardware circuit with one set of instructions and the second module includes a second CPU hardware circuit with another set of instructions.

Based upon the above discussion and illustrations, those skilled in the art will readily recognize that various modifications and changes may be made to the various embodiments without strictly following the exemplary embodiments and applications illustrated and described herein. For example, an apparatus can include additional IO cells and/or an IO cell with additional circuits than illustrated by FIGS. 1 and 2. Such modifications do not depart from the true spirit and scope of various aspects of the invention, including aspects set forth in the claims.

What is claimed is:

1. An apparatus comprising:
   logic circuitry configured and arranged to provide a logic function by processing input signals and providing output signals corresponding to the input signals with the logic function applied thereto;
   a first circuit configured and arranged to communicate signals with the logic circuitry;
   a first bond pad connected to the first circuit via a first circuit path, and configured and arranged to communicate signals with the logic circuitry via the first circuit;
   a second circuit configured and arranged to communicate signals with the logic circuitry;
   a second bond pad connected to the second circuit via a second circuit path, and configured and arranged to communicate signals with the logic circuitry via the second circuit;
   a probe contact connected to the first bond pad and being configured and arranged to communicate signals with an external probe in contact therewith; and
   a switch circuit connected to the probe contact and the second circuit path, the switch circuit being configured and arranged to communicate signals between the probe contact and the second circuit path by selectively connecting and disconnecting the probe contact to the second circuit path in response to the input signals.

2. The apparatus of claim 1, wherein:
   the input signal is an input test signal;
   the first circuit is an input/output (I/O) cell configured and arranged to communicate test signals with the logic circuitry;
   the second circuit is an input cell configured and arranged to communicate test signals with the logic circuitry; and
   the switch circuit is configured and arranged to selectively connect and disconnect the probe contact to the second circuit path by selectively coupling the input test signal to the second circuit path.

3. The apparatus of claim 1, further comprising:
   a third circuit configured and arranged to communicate signals with the logic circuitry;
   a third bond pad connected to the third circuit via a third circuit path, and configured and arranged to communicate signals with the logic circuitry via the third circuit; and
   an additional switch circuit connected to the probe contact and the third circuit path, the additional switch circuit being configured and arranged to communicate signals between the probe contact and the third circuit path by selectively connecting and disconnecting the probe contact to the third circuit path in response to the input signals, the additional switch circuit being configured and arranged with said switch circuit to couple the input signals to different portions of the logic circuitry at different times, based upon data in the input signals.

4. The apparatus of claim 3, wherein the switch circuit and the additional switch circuit are a common switch circuit, configured and arranged to selectively couple the probe contact to the second circuit path and to the third circuit path, in response to the input signals.

5. The apparatus of claim 3, wherein the switch circuit is configured and arranged with the additional switch to serially couple test signals to the first and second circuits, by connecting the second circuit to the probe contact for a first time period, and disconnecting the second circuit from the probe contact after the first time period, and connecting the third circuit to the probe contact for a second time period after the second circuit is disconnected from the probe contact, and disconnecting the third circuit from the probe contact after the second time period.

6. The apparatus of claim 3, wherein:
   the second circuit is configured and arranged to couple test signals between the probe contact and a first portion of the logic circuitry, and
   the third circuit is configured and arranged to couple test signals between the probe contact and a second portion of the logic circuitry, the second portion of the logic circuitry being different from the first portion of the logic circuitry.

7. The apparatus of claim 1, wherein the switch is configured and arranged to selectively connect the probe contact to the second circuit path by selectively providing an impedance that inhibits communication of signals between the probe contact and the second circuit path.

8. The apparatus of claim 1, wherein
   the apparatus includes a further probe contact configured and arranged to communicate signals between an external probe and the switch circuit, and
   the switch circuit is configured and arranged with the further probe contact to selectively connect and disconnect said probe contact to the second circuit path based on the input signals as provided to the switch circuit via the further probe contact.

9. The apparatus of claim 1, wherein
   the first circuit and the second circuit are part of a common input/output (I/O) cell including both the first bond pad and the second bond pad, and
   the I/O cell includes a power rail, electrostatic discharge protection circuitry and switch control circuitry coupled to both the first circuit and the second circuit, the switch control circuitry being configured and arranged with the switch circuit to couple signals that control the switch circuit, to couple the probe contact to the second bond pad and to decouple the probe contact from the second bond pad.

10. The apparatus of claim 1, wherein the first circuit and the second circuit are respectively configured and arranged with the switch circuit to pass input signals presented at the probe contact to the logic circuitry, and to pass output signals from the logic circuitry to the probe contact.

11. The apparatus of claim 1, further including switch control circuitry coupled to the probe contact via the first circuit, the switch control circuitry being configured and arranged to control the switch circuit for selectively connecting and disconnecting the probe contact to the second circuit path based on control signals coupled thereto via the probe contact.

12. An apparatus comprising:
    test circuitry configured and arranged to provide input signals and read output signals;
    logic circuitry configured and arranged to provide a logic function by processing the input signals and providing the output signals in response to the input signals with the logic function applied thereto;
    a first circuit configured and arranged to communicate signals with the logic circuitry;
    a first bond pad connected to the first circuit via a first circuit path, and configured and arranged to communicate signals with the logic circuitry via the first circuit;
    a second circuit configured and arranged to communicate signals with the logic circuitry;

a second bond pad connected to the second circuit via a second circuit path, and configured and arranged to communicate signals with the logic circuitry via the second circuit;

a probe contact connected to the first and second bond pads, the probe contact being configured and arranged to communicate the input signals and the output signals between the test circuitry and the first and second bond pads; and a switch circuit connected to the probe contact and connected to the second circuit path, the switch circuit being configured and arranged to communicate signals between the probe contact and the second circuit path by selectively connecting and disconnecting the probe contact to the second circuit path in response to the input signals.

13. The apparatus of claim 12, wherein the test circuitry is configured and arranged to control the switch circuit by:
providing a first input signal to the probe contact and using the first input signal to operate the switch circuit to inhibit connection of the probe contact to the second circuit path for a first period of time; and
providing a second input signal to the probe contact and using the second input signal to operate the switch circuit to connect the probe contact to the second circuit path for a second period of time.

14. The apparatus of claim 12, wherein
the first circuit is an input/output circuit, and the second circuit is an input circuit,
the first circuit is connected to the logic circuit via a bond wire connected to the first bond pad, and
the second circuit is connected to the logic circuit via a bond wire connected to the first bond pad.

15. The apparatus of claim 12, wherein
the first circuit and the second circuit are part of a common input/output (I/O) cell including both the first bond pad and the second bond pad, and
the I/O cell includes a power rail, electrostatic discharge protection circuitry and switch control circuitry coupled to both the first circuit and the second circuit, the switch control circuitry being configured and arranged with the test circuitry and the switch circuit to couple signals that control the switch circuit, to couple the probe contact to the second bond pad and to decouple the probe contact from the second bond pad, in response to the input signals.

16. The apparatus of claim 12, wherein the switch circuit is configured and arranged to serially couple test signals to the logic circuitry, by
connecting the first circuit to the probe contact for a first time period, and disconnecting the first circuit from the probe contact after the first time period, and
connecting the second circuit to the probe contact for a second time period after the first circuit is disconnected from the probe contact, and disconnecting the second circuit from the probe contact after the second time period.

17. The apparatus of claim 16, wherein:
the first circuit is configured and arranged to couple test signals between the probe contact and a first portion of the logic circuitry, and
the second circuit is configured and arranged to couple test signals between the probe contact and a second portion of the logic circuitry, the second portion of the logic circuitry being different from the first portion of the logic circuitry.

18. A method comprising:
using test circuitry, providing input signals and reading output signals; and
operating logic circuitry to provide logic functions, based on the input signals, that provide the output signals by coupling the input signals to a probe contact,
coupling output signals from the logic circuitry to the probe contact via a first circuit that communicates signals with the logic circuitry, the first circuit being connected to a first bond pad via a first circuit path, and
coupling the input signals from the probe contact to different portions of the logic circuitry by operating a switch circuit to selectively connect and disconnect the probe contact to a second circuit in response to the input signals, the second circuit being connected to a second bond pad via a second circuit path.

19. The method of claim 18, wherein operating the switch circuit includes controlling the switch circuit by applying switch control signals in the input signals to the probe contact.

20. The method of claim 18, wherein coupling the input signals from the probe contact to the different portions of the logic circuitry includes:
coupling the input signals from the probe contact to a first portion of the logic circuitry for a first period of time in response to the input signals including signals specifying a test for a logic function carried out by the first portion of the logic circuitry, and providing first output signals from the first portion of the logic circuitry to the test circuitry, and
after providing the first output signals, coupling the input signals from the probe contact to a second portion of the logic circuitry for a second period of time in response to the input signals including signals specifying a test for a logic function carried out by the second portion of the logic circuitry, and providing second output signals from the second portion of the logic circuitry to the test circuitry.

* * * * *